United States Patent
Yu et al.

(10) Patent No.: US 10,297,579 B2
(45) Date of Patent: May 21, 2019

(54) PACKAGE ON-PACKAGE STRUCTURE WITH EPOXY FLUX RESIDUE

(71) Applicant: Taiwan Semiconductor Manufacturing Company, Ltd., Hsinchu (TW)

(72) Inventors: Chen-Hua Yu, Hsinchu (TW); Wei-Yu Chen, Taipei (TW); Kuei-Wei Huang, Hsinchu (TW); Hsiu-Jen Lin, Zhubei (TW); Ming-Da Cheng, Jhubei (TW); Ching-Hua Hsieh, Hsinchu (TW); Chung-Shi Liu, Hsinchu (TW); Hsuan-Ting Kuo, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/882,593

(22) Filed: Jan. 29, 2018

(65) Prior Publication Data

US 2018/0166421 A1 Jun. 14, 2018

Related U.S. Application Data

(62) Division of application No. 15/228,922, filed on Aug. 4, 2016, now Pat. No. 9,881,903.

(Continued)

(51) Int. Cl.
*H01L 23/48* (2006.01)
*H01L 25/065* (2006.01)
(Continued)

(52) U.S. Cl.
CPC ........ *H01L 25/0657* (2013.01); *H01L 25/105* (2013.01); *H01L 25/50* (2013.01);
(Continued)

(58) Field of Classification Search
CPC ................. H01L 25/0657; H01L 25/50; H01L 23/49816; H01L 24/17; H01L 24/27; H01L 24/32; H01L 24/73; H01L 24/81; H01L 24/83; H01L 24/92; H01L 2224/0401; H01L 2224/13025; H01L 2224/16145; H01L 2224/2731; H01L 2224/2919;
(Continued)

(56) References Cited

U.S. PATENT DOCUMENTS

7,564,115 B2 7/2009 Chen et al.
7,633,165 B2 12/2009 Hsu et al.
(Continued)

*Primary Examiner* — Tu-Tu V Ho
(74) *Attorney, Agent, or Firm* — Slater Matsil, LLP (57) ABSTRACT

A structure includes a first package and a second package. The second package is coupled to the first package by one or more connectors. Epoxy flux residue is disposed around the connectors and in contact with the connectors. A method includes providing a first package having first connector pads and providing a second package having corresponding second connector pads. Solder paste is printed on each of the first connector pads. Epoxy flux is printed on each of the solder paste. The first and second connector pads are aligned and the packages are pressed together. The solder paste is reflowed to connect the first connector pads to the second connector pads while leaving an epoxy flux residue around each of the connections.

20 Claims, 13 Drawing Sheets

Related U.S. Application Data (60) Provisional application No. 62/343,607, filed on May 31, 2016.

(51) Int. Cl.
*H01L 25/00* (2006.01)
*H01L 25/10* (2006.01)
*H01L 23/498* (2006.01)

(52) U.S. Cl.
CPC ............. *H01L 23/49816* (2013.01); *H01L 2224/12105* (2013.01); *H01L 2225/1035* (2013.01); *H01L 2225/1041* (2013.01); *H01L 2225/1058* (2013.01); *H01L 2924/15313* (2013.01); *H01L 2924/3511* (2013.01)

(58) Field of Classification Search
CPC ... H01L 2224/32145; H01L 2224/3204; H01L 2224/8112; H01L 2224/81815; H01L 2224/921; H01L 2225/06513; H01L 2225/06548
USPC .......................................................... 257/737
See application file for complete search history.

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2011/0128711 A1 | 6/2011 | Yim et al. |
| 2013/0270685 A1* | 10/2013 | Yim ............... H01L 23/10 257/686 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2014/0367867 A1 | 12/2014 | Lin et al. |

\* cited by examiner

PACKAGE ON-PACKAGE STRUCTURE WITH EPOXY FLUX RESIDUE

PRIORITY CLAIM AND CROSS-REFERENCE

This application is a divisional of U.S. patent application Ser. No. 15/228,922, filed Aug. 4, 2016, which claims priority to U.S. Provisional Application No. 62/343,607, filed May 31, 2016, which are hereby incorporated in their entirety by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. In addition, when more devices are put into one chip or die, more complex designs are required.

In an attempt to further increase circuit density, three-dimensional integrated circuits (3DICs) have been investigated. In a typical formation process of a 3DIC, two chips are bonded together and electrical connections are formed between each chip and contact pads on a substrate. For example, bonding two chips may be accomplished by attaching one chip on top of the other. The stacked chips are then bonded to a carrier substrate and wire bonds electrically couple contact pads on each chip to contact pads on the carrier substrate. However, this requires a carrier substrate larger than the chips for the wire bonding. More recent attempts have focused on flip-chip interconnections and the use of conductive balls/bumps to form a connection between the chip and the underlying substrate, thereby allowing high-wiring density in a relatively small package. Traditional chip stacking using solder joints involves solder, flux and underfill. All these processes created issues and limitations on pitch, joint height, and flux residue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure include a Package-on-Package (PoP) structure including an upper package and a lower package. The upper package will typically have less input/output requirements than the lower package, as the input/output signals will typically route through the lower package. The upper package can be, for example, an integrated passive device (IPD), random access memory (RAM), such as dynamic random access memory (DRAM), a fan-out structure including stacked semiconductor dies, a wafer level package (WLP), and interposer and so forth. The lower package can have more input/output requirements. The lower package can be, for example, an integrated fan-out wafer level package (InFO) and so forth. Both the upper and lower packages can have redistribution layers (RDLs) or through vias to provide internal connections and routing within each package. Bottom connectors, such as pads, for the upper package can be coupled to top connectors on the top of the lower package, with each respective connection being further coupled to a connector on the bottom of the lower package. In this way, connections for the upper package can be brought to the bottom of the lower package. The pads on the top of the lower package can be coupled to connections on the bottom of the lower package through a via or RDL.

FIGS. 1-6 illustrate a cross-sectional view of components of a PoP structure at various stages of bonding an upper package (Package 1) with a lower package (Package 2). The cross-sectional view provided can be a representation of part of the packages, i.e., a cut out of the packages. The cross-sectional view provided can also be considered as demonstrative of embodiments of the present invention. Other embodiments can include additional connectors and can be of various sizes and shapes. Although the upper package and lower package are illustrated as being substantially the same overall width, it should be understood that one can be wider than the other. In embodiments where one package is wider than the other, the "edge" of the package can be considered to be the outermost edge of the overlapping portion. Any portion of the upper or lower package that extends beyond the overlapping portion can have other components or packages not specifically discussed herein.

The upper package comprises a package substrate and components located thereon. Such components can include, for example, dielectrics, metal layers, wirings, moldings, and so forth. The lower package comprises a package substrate and components located thereon. As with the upper package, such components can include, for example, dielectrics, metal layers, wirings, moldings, and so forth. In some embodiments, the upper package can be an interposer with another second upper package attached thereto. In some embodiments, the attachment can be provided such that the second upper package is first attached to the interposer and then the combination package is coupled to the lower package. In other embodiments, the attachment can be provided such that the interposer is first attached to the lower package and then the second upper package is coupled to the interposer.

A lower wafer (not illustrated) can comprise one or more lower packages. The lower wafer can be a carrier or a substrate of the lower packages. In some embodiments, the upper package can be singulated from an upper wafer and disposed over the lower package so that connectors located on the bottom surface of the upper package correspond to connectors located on the top surface of the lower packages. In some embodiments, the upper package can be joined to the lower package prior to singulation and the resulting PoP structure, discussed in greater detail below, can be singulated together.

Figure 1:
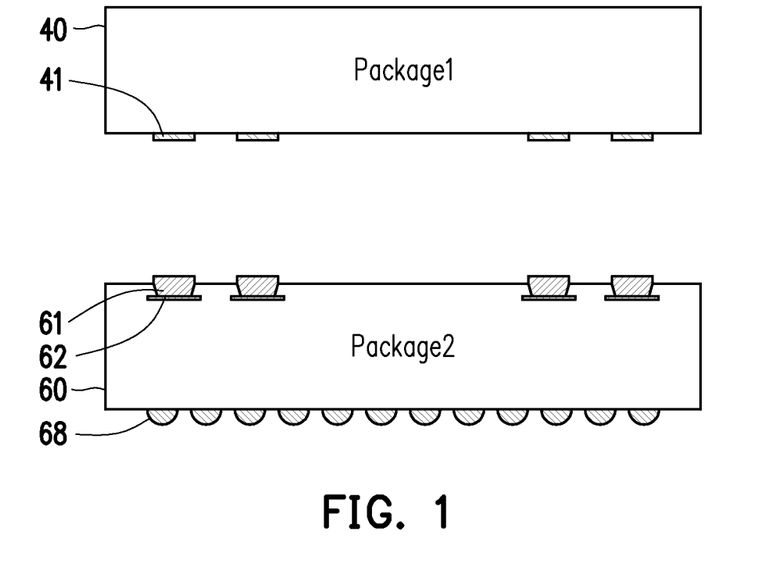
FIGS. 1, 2, 3A, 3B, 3C, 3D, 4A, 4B, 4C, 4D, 5A, 5B, 5C, 5D, and 6 illustrate a cross-sectional view of components of a PoP structure at various stages of bonding an upper package with a lower package, in accordance with some embodiments.

FIG. 1 illustrates a cross-sectional view of components of a PoP structure, in accordance with some embodiments. The PoP structure includes an upper package 40, also labeled as Package 1, and a lower package 60, also labeled as Package 2. In some embodiments, additional packages can be stacked vertically, e.g., on top of Package 1, or horizontally, e.g., on top of Package 2 and next to Package 1. Package 1, for example, can be an IPD, RAM, DRAM, a fan-out structure including stacked semiconductor dies, a WLP and so forth. Package 2, for example, can be an InFO or other package. Package 1 comprises bottom connectors 41. Package 2 comprises one or more under bump metal (UBM) layers 61 which align with one or more of bottom connectors 41. Each UBM can be coupled to one or more inter-metal layers 62, such as layers making up an RDL or connecting to a via. Package 2 further comprises bottom connectors 68, illustrated as solder bumps but which can comprise any suitable connector, such as pins, wires, and so forth. In some embodiments, the UBM 61 of Package 2 can be a pad or other type of electrode exposed through a topmost layer of Package 2.

Figure 2:
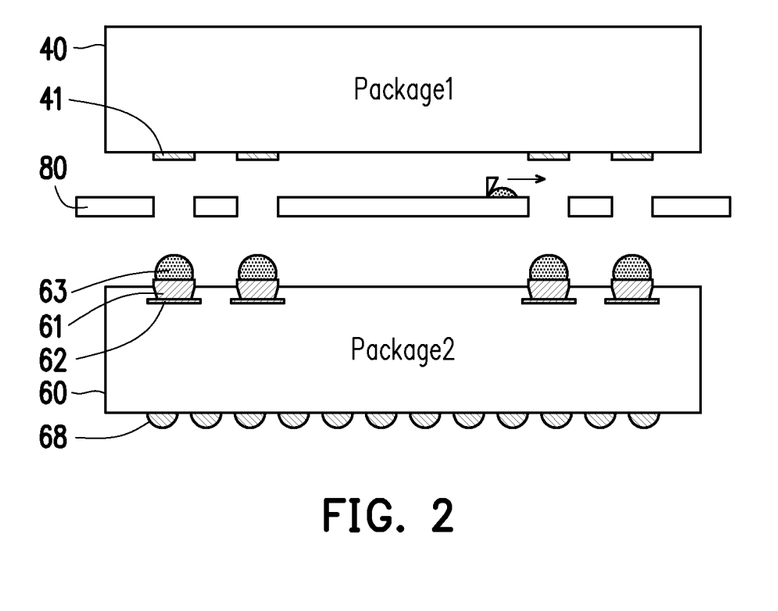

FIG. 2 illustrates a step in bonding packages 1 and 2 together to create a PoP structure. Solder paste can be printed on UBM 61 using a stencil 80. Solder paste can be forced into apertures in stencil 80, leaving solder material 63 on the UBM 61 once stencil 80 is removed. The solder paste 63 on the UBM will make a solder joint with a corresponding connector pad 41 from Package 1. The positioning of stencil 80 can be adjusted as needed to provide a suitable amount of solder paste. For example, stencil 80 can lay atop the second package 60 and in contact with UBM 61. In some embodiments, once the solder paste is formed, the solder can be reflowed to create solder bumps. In other embodiments, the solder paste can remain through the next step. In some embodiments, solder paste can be deposited on UBM 61 using other means and not necessarily a stencil.

FIGS. 3A-5D illustrate various configurations of components of a PoP structure, in accordance with various embodiments. Sub figure designations A, B, C, and D are used consistently with each respective figure to illustrate different options for the PoP structure.

Figure 3A:
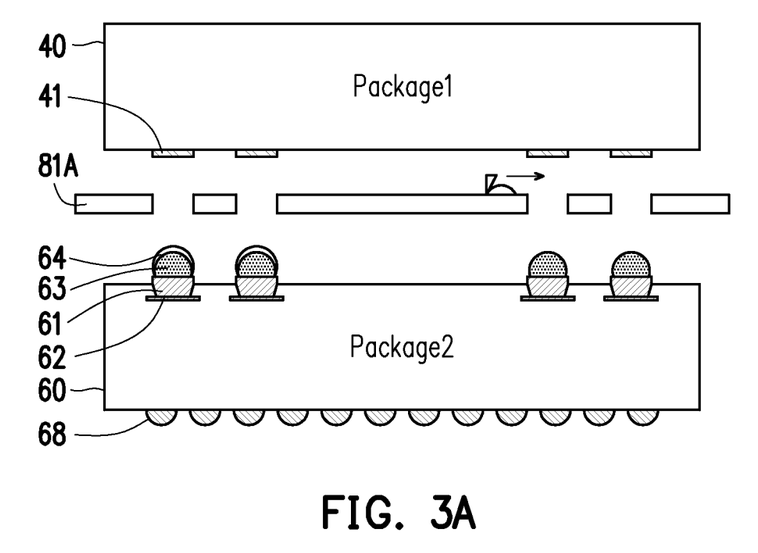

FIG. 3A illustrates the application of a flux epoxy resin 64 on top of the solder 63. Flux epoxy resin 64 is an epoxy-based resin flux. In FIG. 3A stencil 81A is configured to be substantially the same as stencil 80, having apertures situated to provide the application of epoxy flux at each of solder materials 63, solder materials 63 being either reflowed solder balls 631 or solder paste. In some embodiments, flux epoxy resin can be deposited on solder 63 using other means and not necessarily a stencil.

Figure 3B:
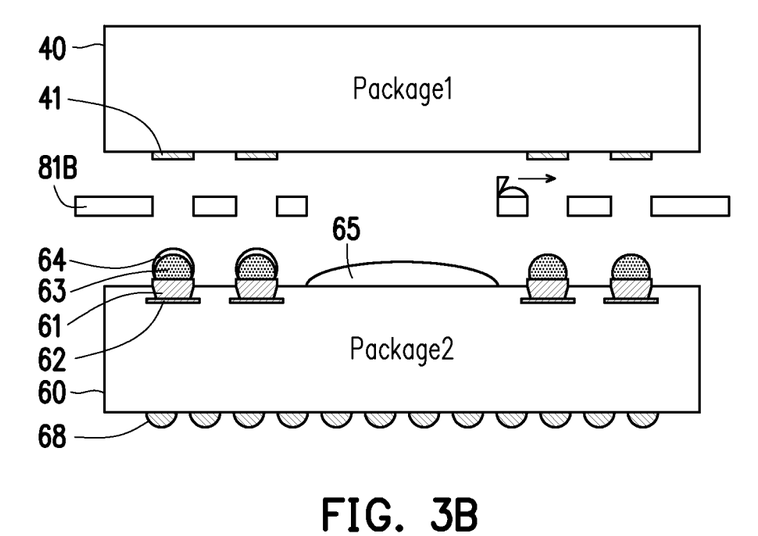

FIG. 3B illustrates the application of a flux epoxy resin 64 on top of the solder 63. Stencil 81B has an additional aperture over stencil 81A between two adjacent UBMs to provide the deposition of epoxy flux between the two adjacent UBMs to serve as a center supporting portion 65. Center supporting portion 65 can assist in reducing warpage of the substrate of the lower package and the resulting PoP structure after bonding the upper package to the lower package. In some embodiments, the center supporting portion 65 can be applied and then cured before applying the epoxy flux resin 64 to each of the solder materials 63. In some embodiments, the center supporting portion 65 can be applied and then cured before applying the solder paste 63 to each of the UBM 61. In embodiments that cure the center supporting portion 65 after the solder past is applied, the solder paste can reflow into solder balls during a cure of the center supporting portion 665. The center supporting portion 65 can be continuous or can comprise multiple smaller applications of epoxy flux. In some embodiments, the center supporting portion 65 can be made from other materials, such as molding compound, a dielectric, or a polymer.

Figure 3C:
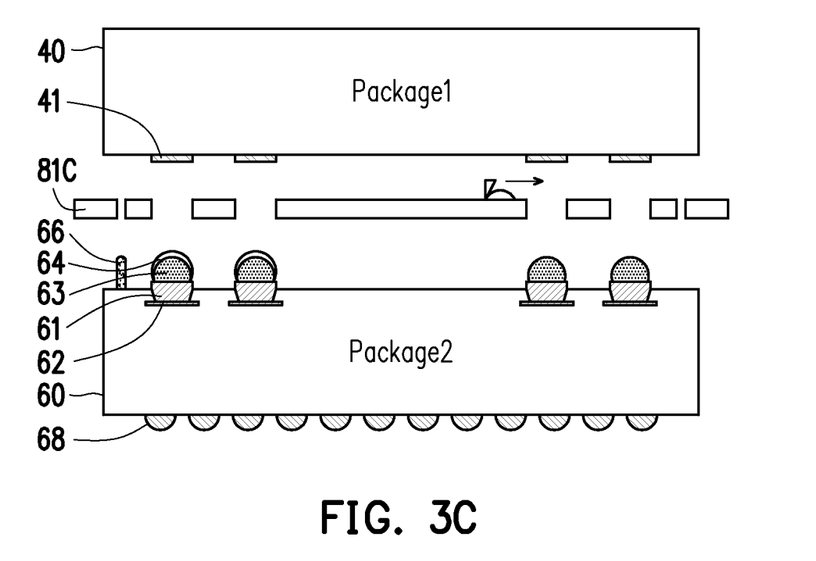

FIG. 3C illustrates the application of a flux epoxy resin 64 on top of the solder 63. Stencil 81C has apertures between an edge UBM and the edge of the PoP structure to provide the deposition of epoxy flux 66 at a periphery of Package 2 between the outer edge of Package 2 and a UBM 61 located near the outer edge. In some embodiments, a UBM 61 need not be located near the peripheral portion 66. In some embodiments, the peripheral portion 66 can be located along the edge of Package 2 or Package 1, or set back slightly from the edge of Package 2 or Package 1, such that the edge of Package 2 or Package 1 is proud from the peripheral portion 66 in plan view. In some embodiments one or more UBM 61 can be located inside the peripheral portion 66 and one or more UBM 61 can be located outside the peripheral portion 66. The peripheral portion 66 can eliminate or reduce the amount of contaminants that might enter the space between Package 1 and Package 2. In some embodiments, the peripheral portion 66 can be made from other materials, such as molding compound, a dielectric, or a polymer.

Figure 3D:
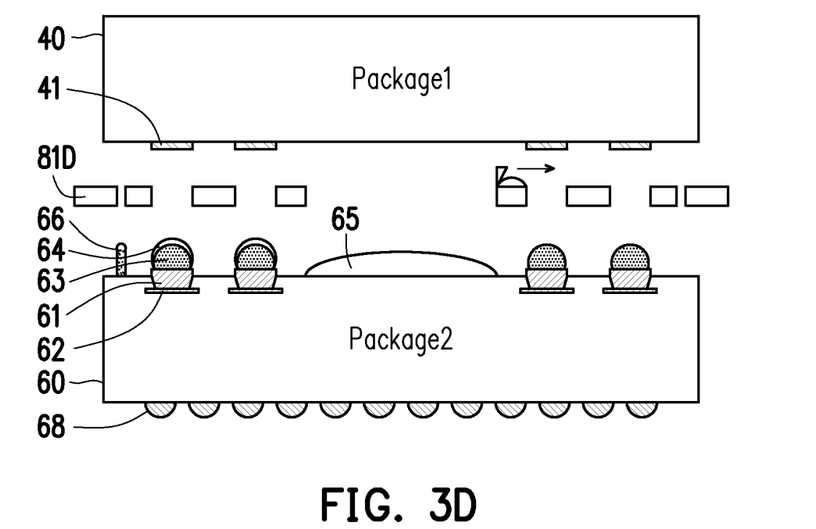

FIG. 3D combines aspects from FIGS. 3B and 3C, providing a center support portion 65 and a peripheral portion 66. Center support portion 65 and peripheral portion 66 can be applied as discussed above in conjunction with FIGS. 3B and 3C, respectively.

Figure 4A:
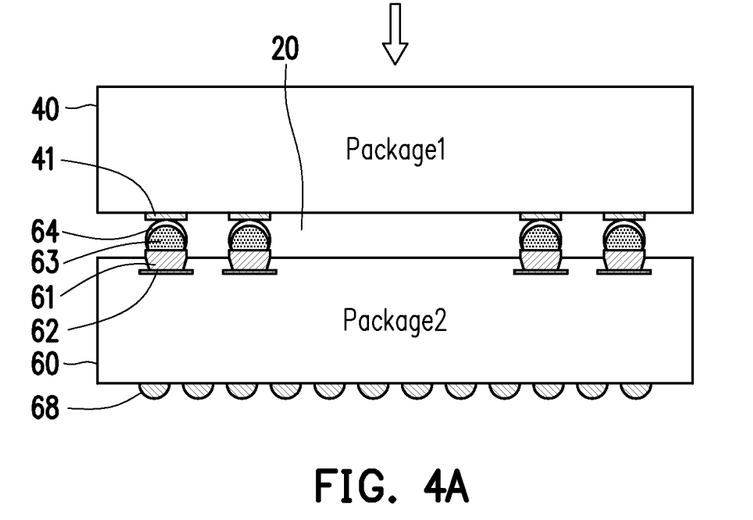

FIG. 4A illustrates the positioning and pressing of the upper package 40 to the lower package 60 for the illustrated arrangement in FIG. 3A. Upper package 40 can be aligned over corresponding connectors 61 of the lower package 60.

Figure 4B:
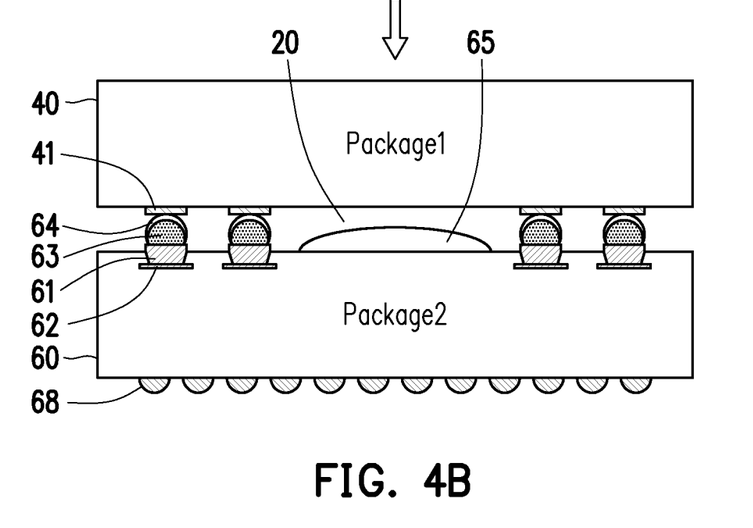
Figure 4C:
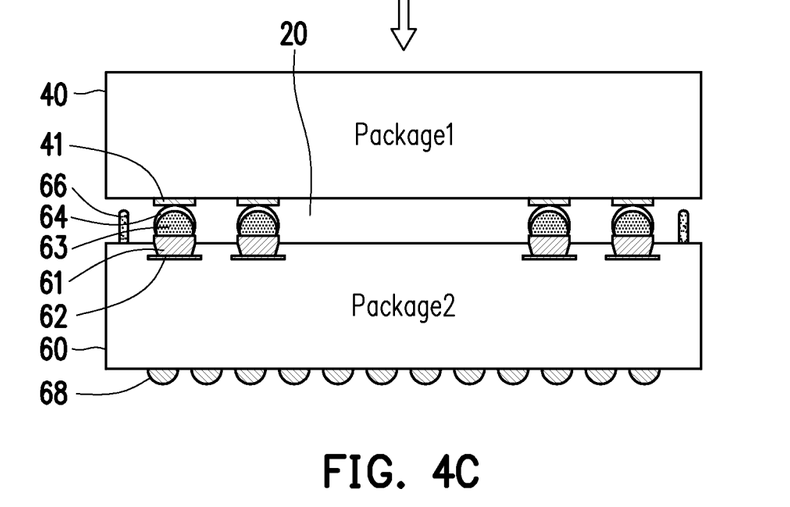
Figure 4D:
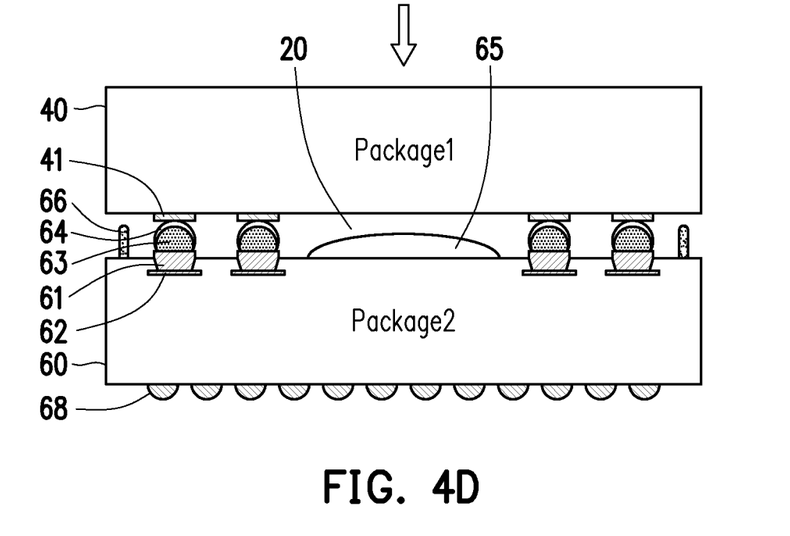

Upper package 40 can be pressed into the lower package 60. FIG. 4B illustrates the positioning and pressing of the upper package 40 to the lower package 60 for the illustrated arrangement in FIG. 3B. FIG. 4C illustrates the positioning and pressing of the upper package 40 to the lower package 60 for the illustrated arrangement in FIG. 3C. FIG. 4D illustrates the positioning and pressing of the upper package 40 to the lower package 60 for the illustrated arrangement in FIG. 3D. The pressing can be accomplished via pick and place or other suitable means. As the packages are pressed together, the solder 63 can be reflowed to couple the upper package 40 to the lower package 60 at the one or more points of connectivity, coupling pad 41 on the upper package 40 to the UBM 61 on the lower package 60. A void 20 can be formed between the upper package 40 and lower package 60, void 20 being the unfilled space between the two packages. Void 20 is free from underfill material.

Figure 5A:
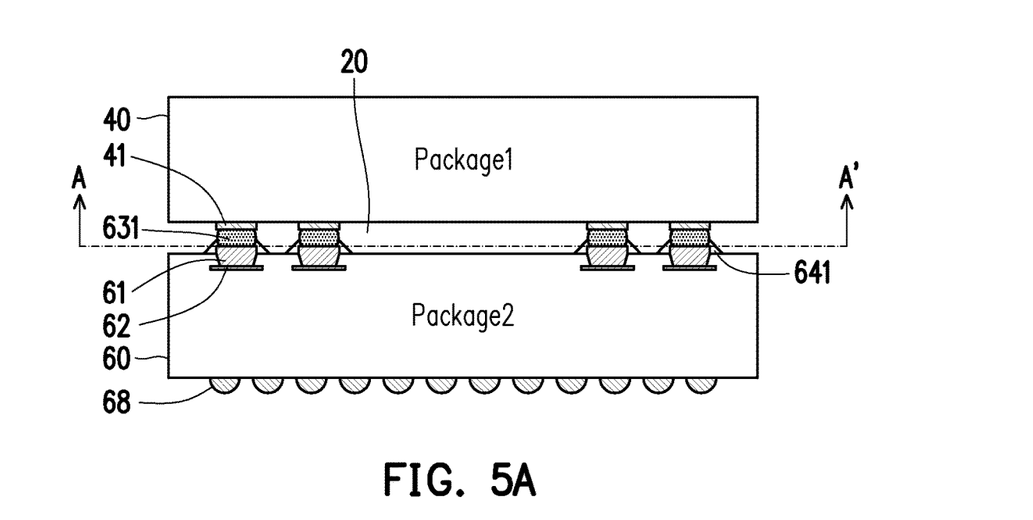

FIG. 5A illustrates upper package 40 and lower package 60 in a PoP structure after solder reflow. As a result of the solder reflow, the resin-based epoxy flux leaves a residue. The epoxy flux residue 641 settles around the base of the reflowed solder 631. Epoxy flux residue 641 can substantially surround the base of the solder connector. Epoxy flux 641 residue can also cover portions of UBM 61 that are exposed from the solder 631. Epoxy flux residue 641 can provide support of the joint of the solder 631 and UBM 61. Epoxy flux residue 641 is an epoxy-based resin.

Figure 5B:
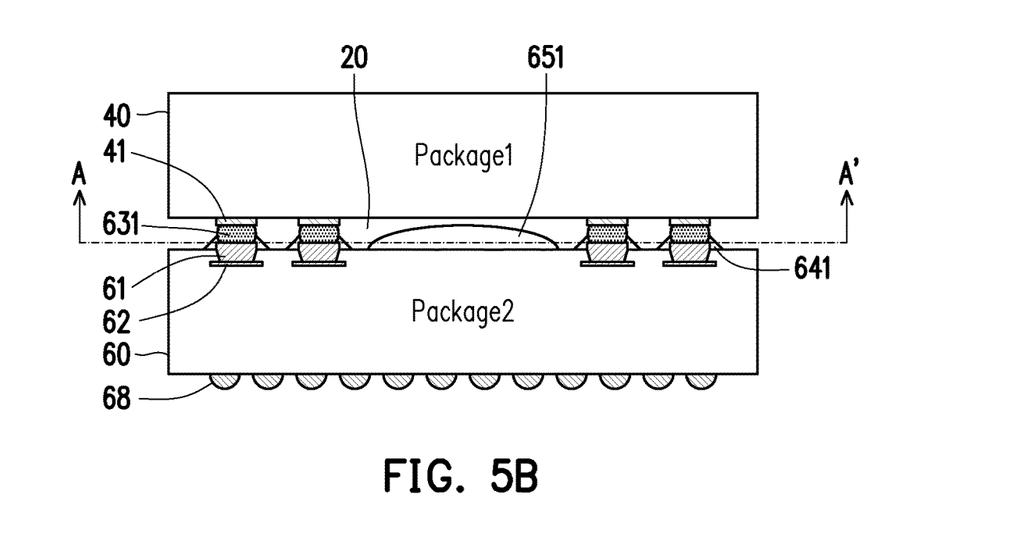

FIG. 5B illustrates the PoP structure after reflow as arranged in FIG. 4B that includes a center supporting portion 651 made from epoxy flux residue. FIG. 5B also includes the epoxy flus residue 641 at the base of and around each of the solder joints 631. In some embodiments, the center supporting portion 651 can have a topmost surface that contacts the bottom surface of the upper package 40. In some embodiments, the center supporting portion 651 can have a top surface that is substantially planar after reflow. In some embodiments, the center supporting portion 651 can have a top surface that is curved, thereby providing that the center supporting portion 651 is thickest in cross-sectional view at its center point and tapering toward the edges of the center supporting portion 651. The center supporting portion 651 will be discussed in greater detail in conjunction with FIGS. 7A and 7B, below. In some embodiments the center supporting portion 651 may be partially cured following the reflow and may require an additional curing step.

Figure 5C:
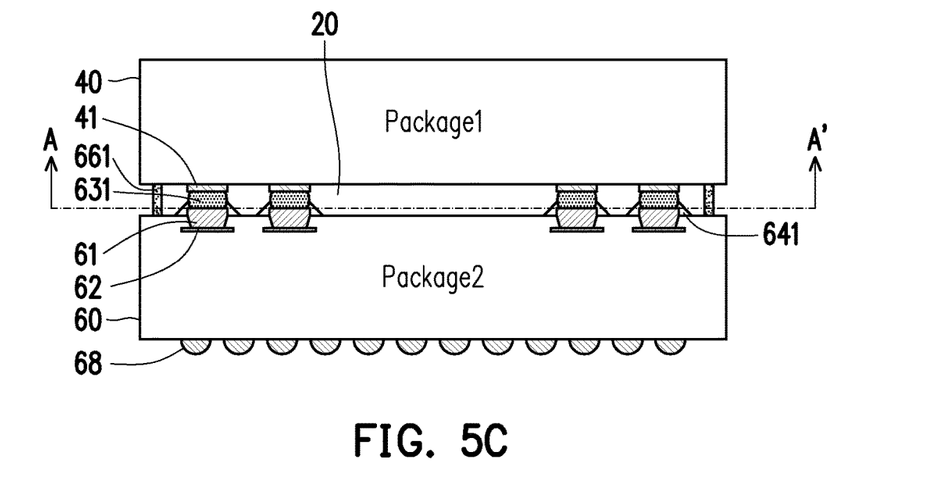
Figure 5D:
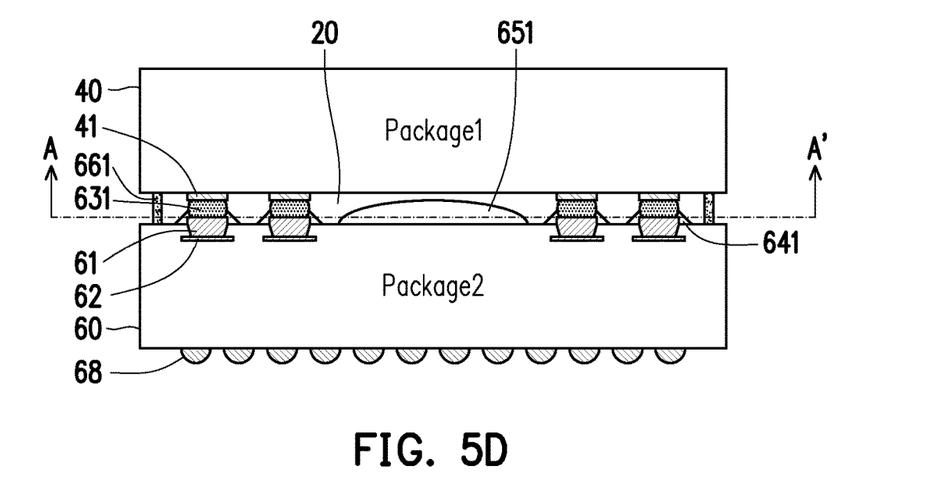

FIG. 5C illustrates the PoP structure after reflow as arranged in FIG. 4C that includes a peripheral portion 661 made from epoxy flux residue. FIG. 5C also includes the epoxy flux residue 641 at the base of and around each of the solder joints 631. In some embodiments, the top of peripheral portion 661 can contact the bottom surface of the upper package 40. In some embodiments, a purpose of the peripheral portion can be to provide a continuous barrier to aide in keeping contaminants out of the void 20 between the upper and lower packages in the package structure. In some embodiments, at least some of the peripheral portion 661 can have a top surface that does not touch the bottom surface of the upper package 40. In some embodiments, the peripheral portion 661 can have breaks in continuity in plan view such that the peripheral portion does not continuously surround the PoP structure. For example, FIG. 5A or 5B can be considered representative cross-sectional views of the structure of FIG. 5C or 5D, respectively, where a break in the peripheral portion 661 occurs. Another cross-section of the same structure at a different cut-line could illustrate one of the left or right sides of peripheral portion 661 while the other of the left or right sides of peripheral portion 661 is not viewable. The peripheral portion 661 will be discussed in greater detail in conjunction with FIGS. 8A and 8B, below. In some embodiments the peripheral portion 661 may be partially cured following the reflow and may require an additional curing step.

In FIGS. 5A-D, void 20 can remain free from underfill material. In embodiments where the epoxy resin used for center supporting portion 651 or peripheral portion 661 can be considered an underfill, void 20 will still remain as illustrated in FIGS. 5A-D.

Figure 6:
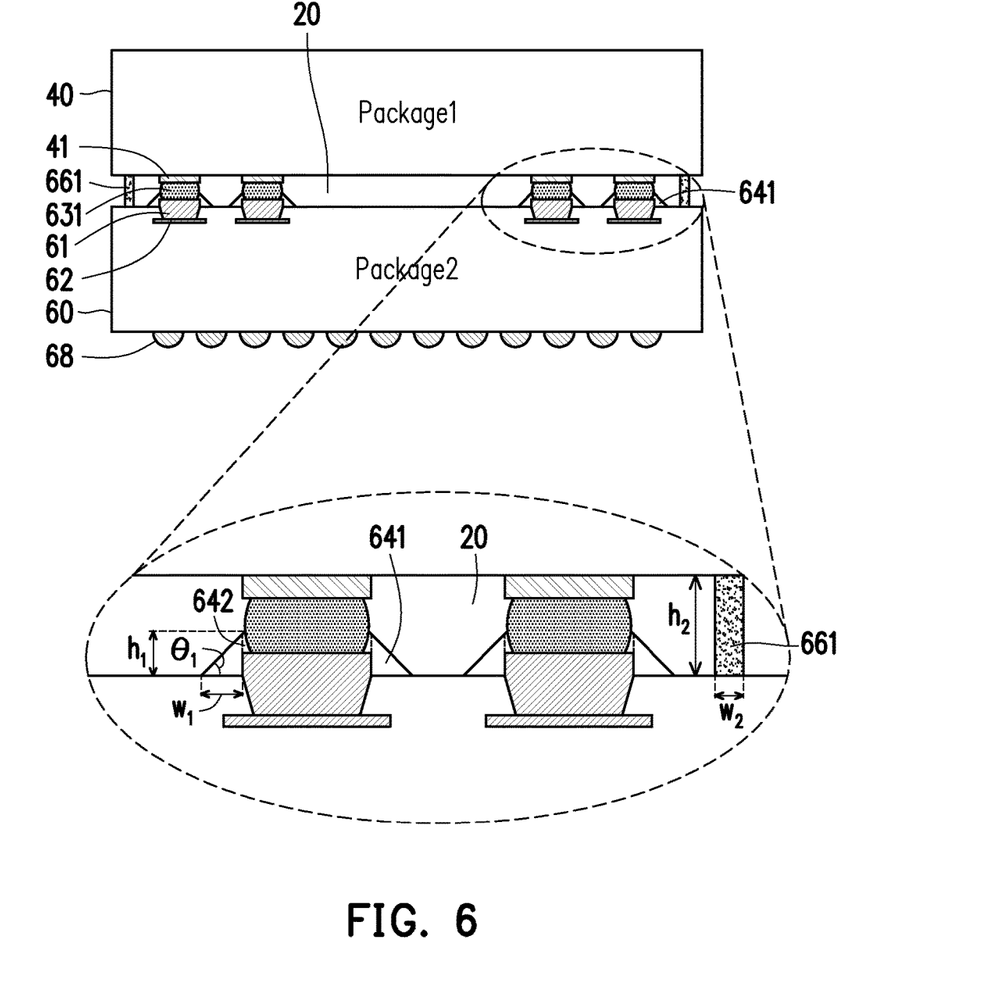

FIG. 6 illustrates an exploded view of the one or more connections between the upper package 40 and lower package 60. After reflow, solder 631 will bridge pad 41 to UBM 61. Epoxy flux residue 641 will form around the base of the solder 631. Depending on how the epoxy flux 64 was printed as illustrated for example in FIGS. 3A-3D, epoxy flux residue 641 can have variations in its height $h_1$ at a given point. A first width, measured from the UBM 61 laterally to the edge of the epoxy flux residue 641 can also vary around the outer edge of the epoxy flux residue 641 in plan view. In some embodiments, the epoxy flux residue 641 will be substantially circular in plan view. An angle $\theta_1$ of the epoxy flux residue can be between 30 and 60 degrees. In some embodiments the angle $\theta_1$ can be more than 60 degrees or less than 30 degrees. The angle $\theta_1$ can depend on the viscosity of the epoxy flux and reflow procedure details. Where the solder 631 does not cover the UBM 61 to its outer edge, a portion of epoxy flux residue 642 can remain in contact with the UBM 61 and the solder 631 at the joint therebetween and following the shape of the outer surface of the solder 631 up to height $h_1$.

In embodiments where a peripheral portion 661 is used, the peripheral portion can have a height $h_2$ and width $w_2$. The height $h_2$ can be the same as the height of the void 20 between the upper and lower packages, such that the upper surface of the peripheral portion 661 contacts the lower surface of the upper package 40. In some embodiments, the height $h_2$ can be less than the height of the void 20, leaving a gap between the top of peripheral portion 661 and the bottom surface of the upper package 40. In some embodiments the width at the top of peripheral portion 661 can be narrower than the width $w_2$, at the bottom of peripheral portion 661. In other words, although shown as a rectangle, the peripheral portion 661 can appear to be trapezoidal in plan view, with the top being narrower than the bottom. When the epoxy flux is applied and the solder is reflowed, the epoxy flux can slump. The amount of slump can depend on the epoxy flux viscosity and other factors, such as the reflow procedure. The width $w_2$ can be selected such that the epoxy flux for peripheral portion 661 does not slump so much as to cause a gap between the top of the epoxy flux and the bottom surface of the upper package.

It should be noted that in each of FIGS. 5A-5D and FIG. 6, no underfill needs to be used between the coupled upper and lower packages to fill void 20.

Figure 7A:
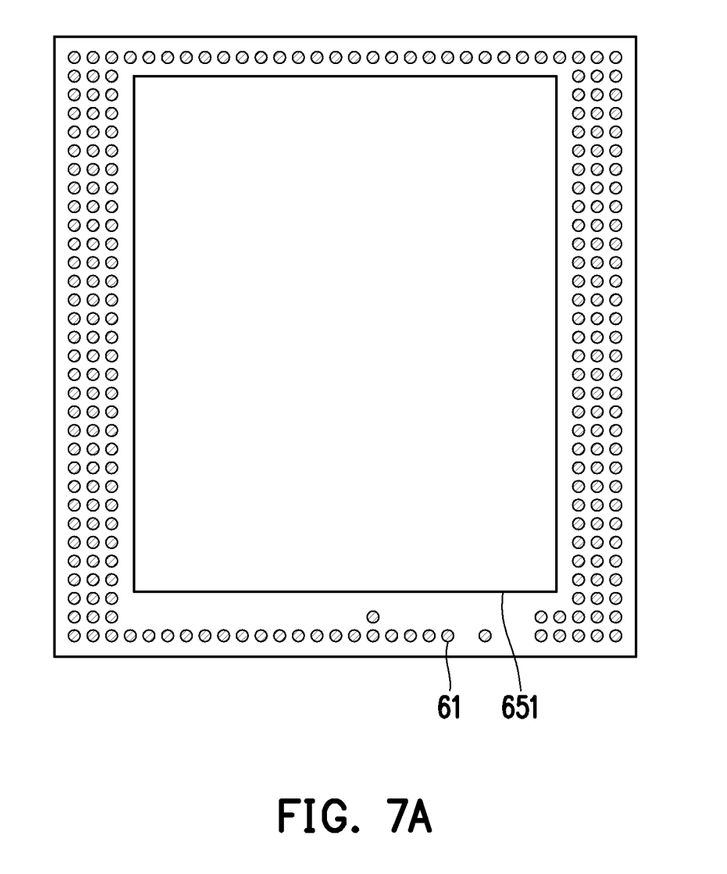
FIGS. 7A, 7B, 8A, and 8B illustrate a plan view of components of a PoP structure, in accordance with some embodiments

FIG. 7A illustrates a cross-section of a PoP structure in plan view, in accordance with some embodiments. The cross-section of FIG. 7A can be a cross-section along the cut line A-A' of FIG. 5B, taken above the surface of the lower package, through the UBM 61 where the UBM 61 protrudes from the lower package 60. Center supporting portion 651 can be a continuous application of epoxy flux across a center portion of a PoP structure. In some embodiments, center supporting portion 651 can be applied and cured prior to the application of solder paste and epoxy flux on the UBM 61. In other embodiments, the center supporting portion 651 can be applied along with the epoxy flux. Although center supporting portion 651 is illustrated as a rectangle, it can be printed as any shape in plan view. In some embodiments, it may be printed as a multiple of rectangles or shapes. In some embodiments, center supporting portion 651 will be absent, such as in embodiments consistent with FIG. 5A.

Figure 7B:
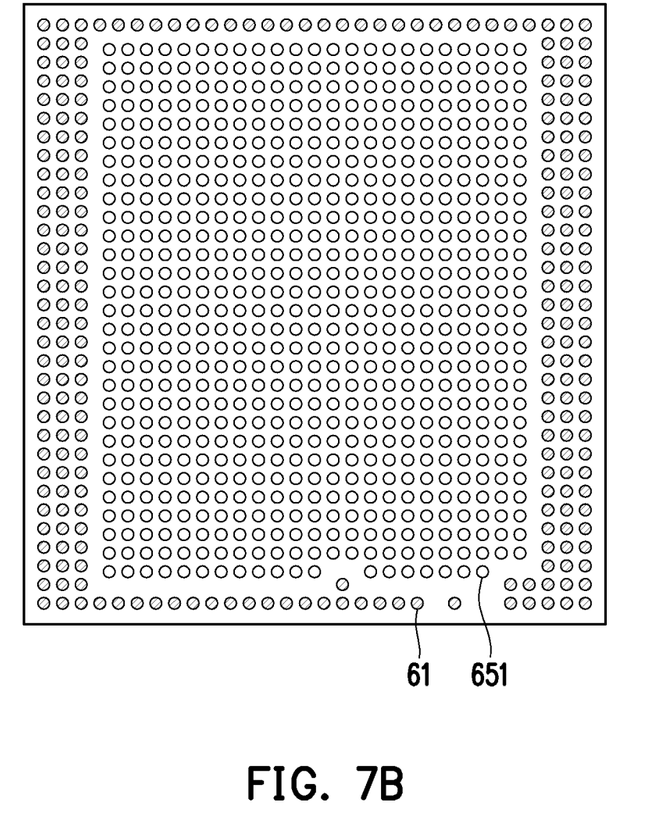

FIG. 7B illustrates a cross-section of a PoP structure in plan view, in accordance with some embodiments. The cross-section of FIG. 7B can be a cross-section along the cut line A-A' of FIG. 5B, taken above the surface of the lower package, through the UBM 61 where the UBM 61 protrudes from the lower package 60. Center supporting portion 651 can be a grid of circular epoxy paste bumps. Although FIG. 7B illustrates these as substantially uniform in size and pitch, the number, size, and pitch of the epoxy paste bumps making up the center supporting portion 651 can be varied. These can also be varied such that they are not uniformly sized or positioned. In some embodiments, center supporting portion 651 can be made into any shape or series of shapes in plan view. For example, center supporting portion 651 can be made up of a series of smaller rectangles. Center supporting portion 651 can provide stability for the lower and/or upper package to reduce warpage.

Figure 8A:
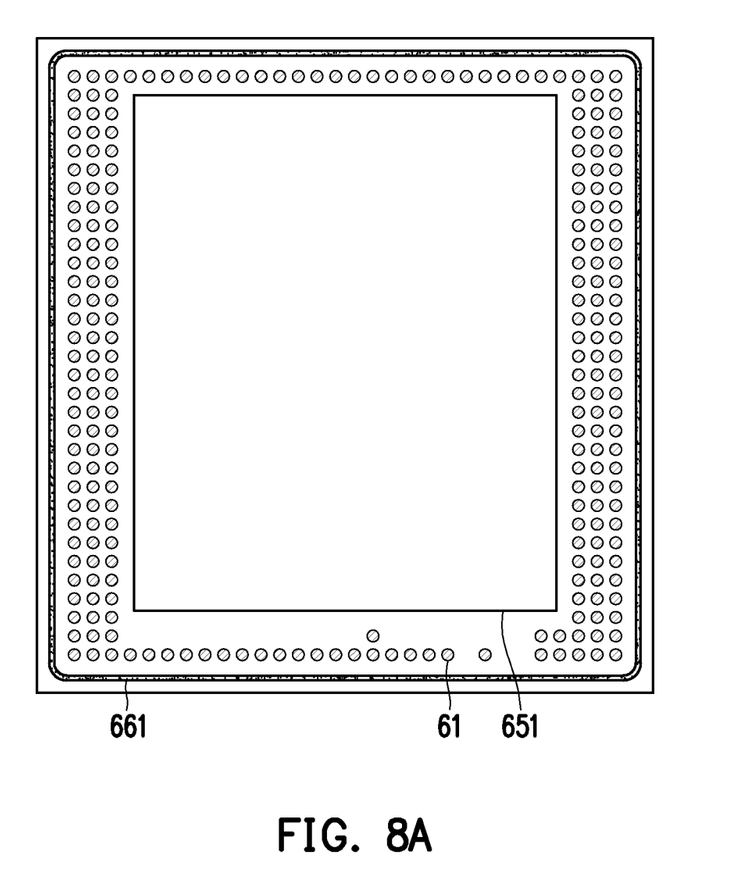

FIG. 8A illustrates a cross-section of a PoP structure in plan view, in accordance with some embodiments. The cross-section of FIG. 8A can be a cross-section along the cut line A-A' of FIG. 5D, taken above the surface of the lower package, through the UBM 61 where the UBM 61 protrudes from the lower package 60. Center supporting portion 651 can be a continuous application of epoxy flux across a center portion of a PoP structure, such as described above in conjunction with FIG. 7A. Peripheral portion 661 can run near the edge of the lower and upper packages, where the lower and upper packages overlap. In some embodiments, peripheral portion 661 can be a continuous annular ring. In some embodiments, peripheral portion 661 can be a dashed annular ring, indicating breaks in the epoxy flux or portions where the epoxy flux does not meet the bottom of the upper package. In some embodiments, peripheral portion 661 can be another shape or positioned elsewhere such that some connectors such as UBM 61 lie outside the peripheral portion 661. In some embodiments, peripheral portion 661 can be continuous in some portions and dashed in other portions. In some embodiments, peripheral portion 661 can be on one or more sides of the package structure. Although peripheral portion 661 is indicated as having rounded corners, in some embodiments, peripheral portion 661 can have substantially square corners or rounded corners of various radii. In some embodiments, center supporting portion 651 will be absent, such as in embodiments consistent with FIG. 5C.

Figure 8B:
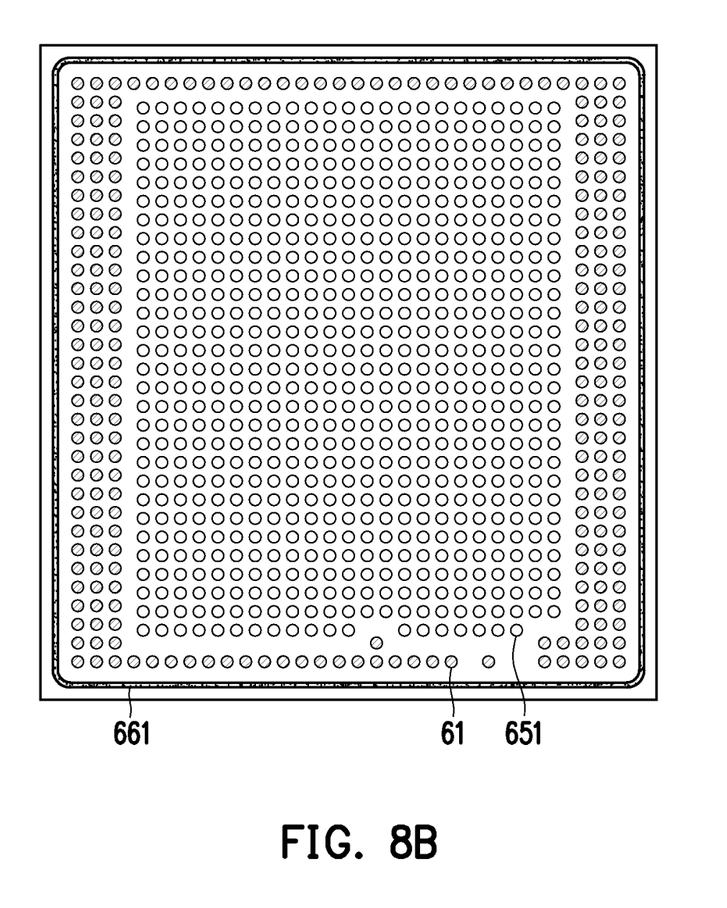

FIG. 8B illustrates a cross-section of a PoP structure in plan view, in accordance with some embodiments. The cross-section of FIG. 8B can be a cross-section along the cut line A-A' of FIG. 5D, taken above the surface of the lower package, through the UBM 61 where the UBM 61 protrudes from the lower package 60. Center supporting portion 651 can be a grid of circular epoxy paste bumps such as described above in conjunction with FIG. 7B. Peripheral portion 661 can run near the edge of the lower and upper packages, where the lower and upper packages overlap. Just as described above with FIG. 8A, peripheral portion 661 can be configured in a variety of alternatives, including those described above in conjunction with FIG. 8A.

Figure 9:
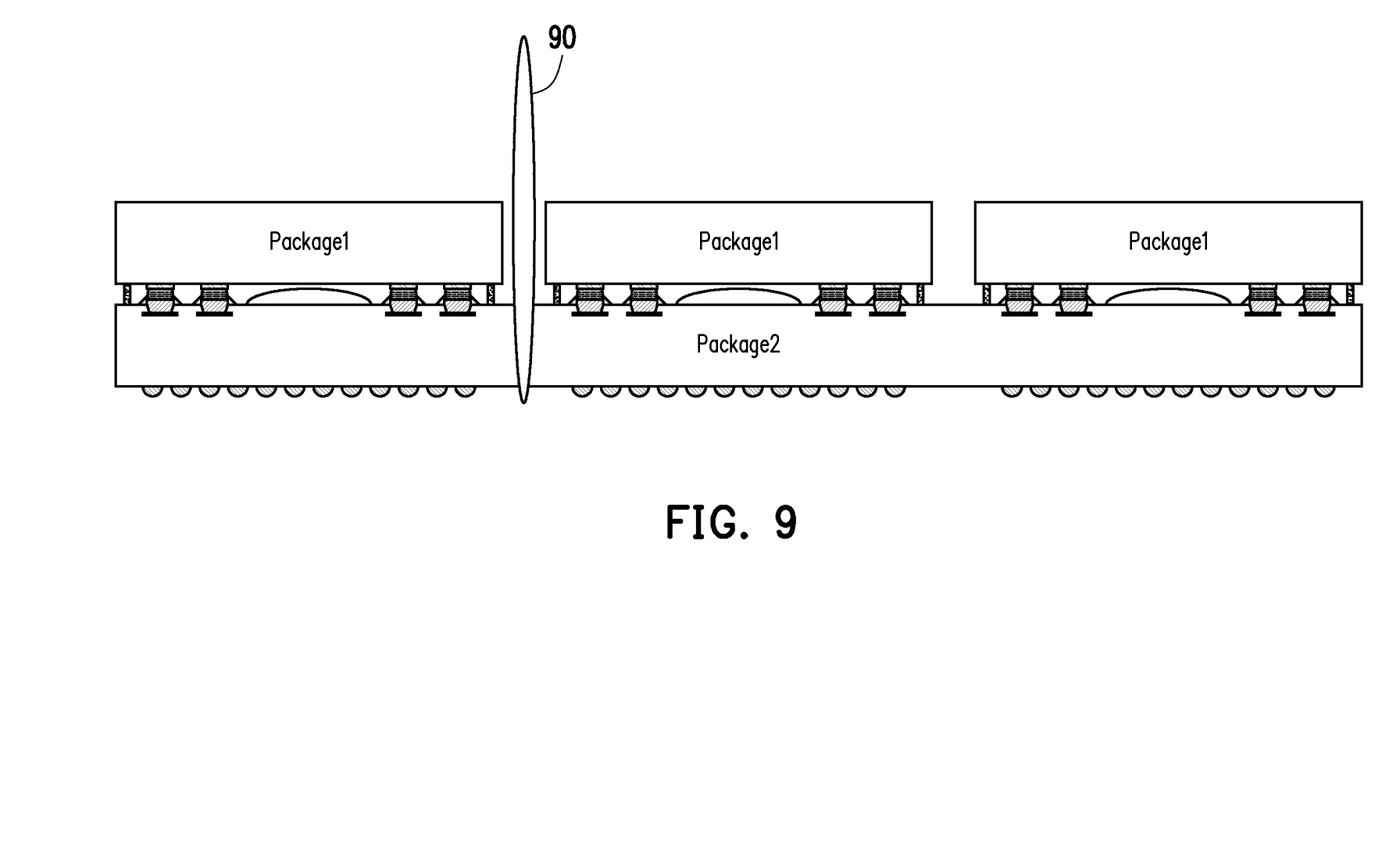
FIG. 9 illustrates a cross-sectional view of a PoP structure in relation to a wafer and singulation thereof, in accordance with some embodiments.

FIG. 9 illustrates a PoP structure in accordance with some embodiments. FIG. 9 illustrates that the lower package can include multiple lower packages formed in a wafer. The upper package, Package 1, can be coupled to the lower package as described above. Next, a saw 90 can singulate the PoP structures. Prior to singulation additional packages can be bonded as described above. FIG. 9 also illustrates to the right of the saw 90 that, in some embodiments, multiple upper packages can be coupled to the lower package in a PoP structure with two side-by-side upper packages. For example, in some embodiments, two or more side-by-side upper structures can be bonded to one lower structure.

Advantages of embodiments include that the area between the two packages in the PoP structure do not need underfill material. In the application of underfill, underfill can creep, coming out from between the two packages; underfill can have void pockets of air. By eliminating the need for underfill, the potential issues with underfill can be avoided. By keeping the flux epoxy residue, a flux cleaning step can be eliminated. Other advantages of some embodiments include that a center supporting portion 651 material can be created out of epoxy flux and can help reduce warpage, thereby achieving PoP joint yield and thermal cycling performance. Other advantages of some embodiments include that a peripheral portion 661 can be created out of epoxy flux and can act as a full or partial barrier to potential contaminants. Other advantages of embodiments allows for the flexible application of solder and epoxy flux materials.

In some embodiments, a structure includes a first package and a second package. The second package is coupled to the first package by one or more connectors. Epoxy flux residue is disposed around the connectors and in contact with the connectors.

In some embodiments, a structure includes a first package and a second package. The second package is coupled to the first package by one or more solder connections. Epoxy flux residue contacts a side of the solder connections and an uppermost surface of the first package. A void between the first and second packages is free from underfill material.

In some embodiments, a method includes providing a first package having first connector pads and providing a second package having corresponding second connector pads. Solder paste is printed on each of the first connector pads. Epoxy flux is printed on each of the solder paste. The first and second connector pads are aligned and the packages are pressed together. The solder paste is reflowed to connect the first connector pads to the second connector pads while leaving an epoxy flux residue around each of the connections.

In some embodiments, a package includes a first device, where the first device is an integrated fan-out package with a top surface having contact pads disposed thereon. The package includes a second device and a plurality of connectors interposed between the contact pads of the first device and the second device, where the plurality of connectors couple the first device to the second device. The package further includes a void is between the first device and the second device. The package also includes epoxy-based resin surrounding an interface between the plurality of connectors and a corresponding contact pad of the first device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first package, the first package being an integrated fan out package;
a second package coupled to the first package by one or more connectors;
epoxy-based resin disposed around the one or more connectors, the epoxy-based resin contacting the one or more connectors; and
a center support structure disposed between two connectors on a top surface of the first package, wherein a void is interposed between the center support structure and the second package.

2. The structure of claim 1, wherein the center support structure comprises epoxy-based resin.

3. The structure of claim 1, further comprising:
a peripheral portion disposed at a periphery of an overlap of the first package and the second package, between the first and second packages.

4. The structure of claim 3, wherein the peripheral portion comprises epoxy-based resin.

5. The structure of claim 1, wherein the epoxy-based resin comprises epoxy flux residue.

6. The structure of claim 1, wherein the center support structure is separated from the epoxy-based resin.

7. The structure of claim 3, wherein the peripheral portion is separated from the epoxy-based resin, wherein at least a portion of the peripheral portion contacts the first package and not the second package.

8. A device comprising:
a first package;
a second package coupled to the first package by one or more solder connections;
a first epoxy-based resin contacting a side of the one or more solder connections and an upper surface of the first package; and
a second epoxy-based resin contacting the upper surface of the first package, the second epoxy-based resin being separated from each of the one or more solder connections, wherein a void between the second epoxy-based resin of the first package and the second package is free from underfill material, wherein the first epoxy-based resin and second epoxy-based resin do not contact a bottom surface of the second package.

9. The device of claim 8, further comprising:
a peripheral material disposed on the first package at a periphery of the second package.

10. The device of claim 9, wherein the peripheral material completely surrounds the periphery of an overlap of the first and second packages.

11. The device of claim 8, wherein the first package comprises an under bump metal layer under each of the one or more solder connections.

12. The device of claim 11, wherein the first package further comprises:
a connector on a bottom surface of the first package; and
a via coupling at least one of the under bump metal layers to the connector on the bottom surface of the first package.

13. The device of claim 8, wherein the first epoxy-based resin and the second epoxy-based resin each comprise the same material composition.

14. A package comprising:
a first device, the first device comprising an integrated fan-out package with a top surface having contact pads disposed thereon;
a second device;
a plurality of connectors interposed between the contact pads of the first device and the second device, the plurality of connectors coupling the first device to the second device, wherein a void is between the first device and the second device;
epoxy-based resin surrounding an interface between each of the plurality of connectors and a corresponding contact pad of the first device; and
a peripheral barrier disposed between the first device and the second device, the peripheral barrier surrounding at least one of the plurality of connectors, the peripheral barrier being separated from the epoxy-based resin.

15. The package of claim 14, wherein the void extends laterally between two connectors of the plurality of connectors.

16. The package of claim 14, further comprising:
a support material disposed on the top surface of the first device between two connectors of the plurality of connectors.

17. The package of claim 14, further comprising:
a support material disposed on the top surface of the first device at a middle portion of the first device.

18. The package of claim 14, wherein all of the plurality of connectors are disposed within the peripheral barrier.

19. The package of claim 14, wherein the peripheral barrier and epoxy-based resin comprise the same material composition.

20. The package of claim 14, wherein the peripheral barrier includes multiple separated segments.

* * * * *